United States Patent [19]

Wiblin

[11] 4,267,544
[45] May 12, 1981

[54] MAGNETIC CONTROL APPARATUS
[75] Inventor: Wayne T. Wiblin, Ashtabula, Ohio
[73] Assignee: Towmotor Corporation, Mentor, Ohio
[21] Appl. No.: 131,728
[22] Filed: Nov. 8, 1979
[51] Int. Cl.³ .................. H01L 43/04; H01L 43/06
[52] U.S. Cl. .................................. 338/32 H; 180/315
[58] Field of Search .................. 338/32 R, 32 H; 323/94 H; 310/68 R, DIG. 3; 324/251, 252; 180/77 R; 74/478, 512, 513, 560, 561

[56] References Cited
U.S. PATENT DOCUMENTS

| | | | |
|---|---|---|---|
| 3,703,695 | 11/1972 | Mogi | 338/32 R |
| 3,771,092 | 11/1973 | Greger | 338/32 R |
| 3,845,445 | 10/1974 | Braun et al. | 338/32 H |

*Primary Examiner*—C. L. Albritton
*Attorney, Agent, or Firm*—Phillips, Moore, Weissenberger, Lempio & Majestic

[57] ABSTRACT

Magnetic control apparatus (32) for intensifying a magnetic field to actuate a magnetic control member (34) and for preventing simultaneous actuation of a pair (34, 36) of magnetic control members. In one (32) of several embodiments a pair (38, 40) of selectively movable magnets each respectively produces a magnetic field which, when a magnet is moved into position, is directed by a pair (42, 54) of elongated bars across the pair (34, 36) of control members to actuate one of the members in response to the field. The pair (42, 54) of bars bypass the magnetic fields from the control members (34, 36) when both magnets (38, 40) are in such a position to attempt to actuate the control members (34, 36). The pair (42, 54) of elongated bars intensify the magnetic fields at the control members (34, 36), thereby permitting the use of relatively weak magnets at a substantial distance from the members (34, 36). The pair (42, 54) of bars also provide a magnetic interlock, preventing undesirable simultaneous actuation of the members (34, 36). The apparatus (32) can be used on a pedal (100) of a fork lift truck to actuate one member (34) to shift a transmission into forward drive and to actuate the other member (36) to shift the transmission into reverse drive. Also disclosed is magnetic control apparatus (10) to perform only the function of field intensification.

8 Claims, 10 Drawing Figures

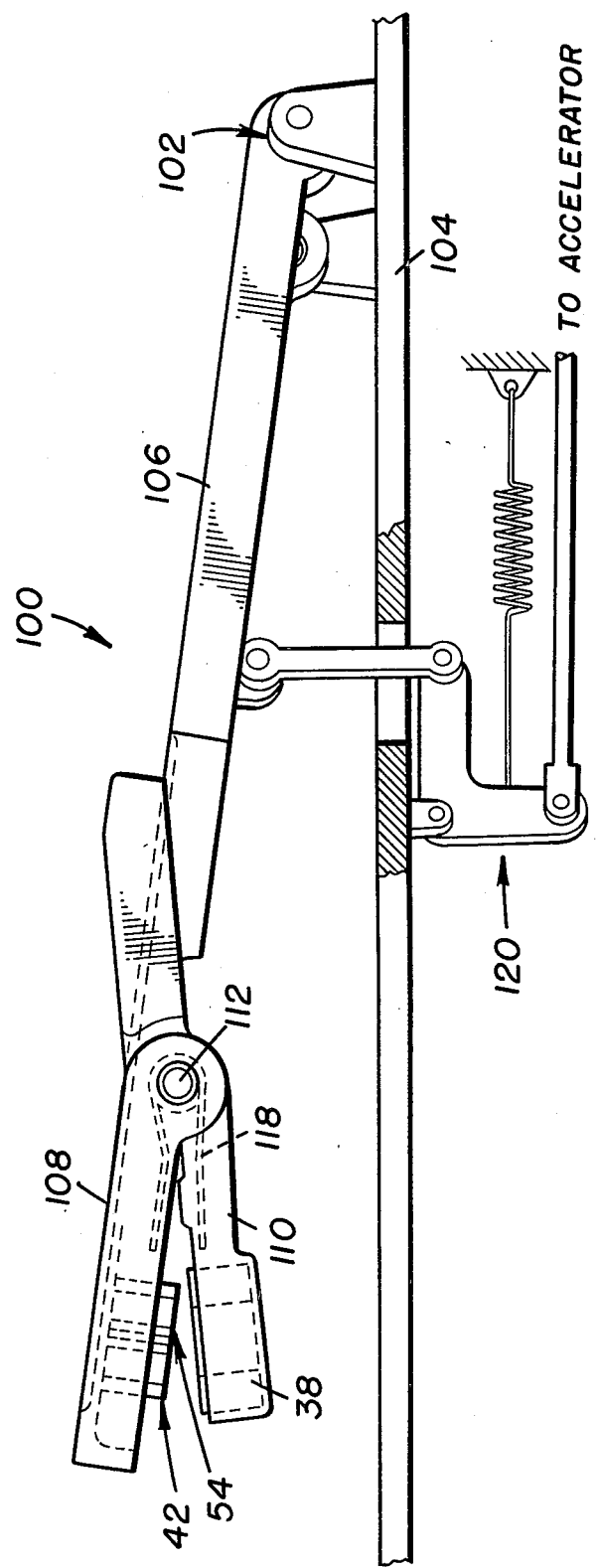

MAGNETIC CONTROL APPARATUS

DESCRIPTION

1. Technical Field

This invention relates to magnetic control apparatus and, more particularly, to apparatus for intensifying a magnetic field to actuate a magnetic control member and to inhibit simultaneous actuation of a pair of magnetic control members.

2. Background Art

In a number of control systems, a magnetic control member is utilized for various functions such as switching on electrical or hydraulic circuits. For example, one widely used control member is a Hall effect device or switch which responds to an applied magnetic field by turning on or becoming electrically conductive. The current density of a Hall effect device is a function of the magnitude of the applied magnetic field; therefore, for many applications it is desirable to intensify or concentrate this field at the device.

Magnetic field intensity can be produced in several ways. For example, intensification of the field through the Hall effect device is possible by using relatively stronger magnets which produce the field and which are spaced some distance from such a device. However, the use of stronger magnets usually occurs at the expense of the size, weight and cost of the magnets. For example, in control systems where space and weight are important, the larger magnets may not be optimally compact and light.

Alternatively, weaker magnets can be employed to produce the magnetic field. However, this normally necessitates positioning these weaker magnets in close proximity to the Hall effect device for adequate field intensity. As a result, there is less flexibility in positioning these weaker magnets when designing the control system.

Another approach to intensifying the magnetic field is the addition of a screw that is threaded to the back of the Hall effect device. The screw functions as a flux concentrator which channels more of the available field from the magnet into the switch to make the switch more sensitive. This has the disadvantage of necessitating modification of the Hall effect device by providing an internally threaded bore to receive the screw. Also, while the screw is a field intensifier, it is used primarily as a fine tuner or adjuster to channel the precise flux density from, for example, a weak magnet positioned close to the Hall effect device.

Other problems occur when using two or more magnetic control members such as Hall effect devices in a control system. For example, in vehicles such as fork lift trucks, a pedal is used to control the acceleration and direction of movement of the truck. The pedal has an acceleration portion and separate forward drive and reverse drive portions. A pair of Hall effect devices are mounted on the acceleration portion with magnets mounted, respectively, on the forward drive and reverse drive portions. When the magnet on the forward drive portion is brought into proximity with one of the Hall effect devices, the latter will switch on to energize a solenoid of a valve to shift a transmission, and, hence, the truck into forward drive. When the magnet on the reverse drive portion is brought into proximity with the other Hall effect device, the latter is switched on to energize another solenoid of the valve to shift the transmission and hence the truck into reverse drive.

One particular problem is that it is possible for the pedal to be operated such that both magnets are simultaneously brought into proximity with the respective Hall effect devices. As a result, both these devices are simultaneously turned on in an attempt to actuate both solenoids of the valve. As a result, the transmission will be shifted into both forward and reverse drive, whereby control of the vehicle can be lost and damage to the transmission would occur.

One solution to the above problem of simultaneously turning on the Hall effect devices is to provide an electronic interlock. This interlock is a logic circuit that will allow one or the other of the solenoids of the valve to be energized when one or the other of the Hall effect devices is actuated. However, the logic circuit can determine if both Hall effect devices are being turned on simultaneously and prevent energization of both solenoids or neutralize the transmission.

While the electronic interlock operates adequately, it does require the use of a number of components in addition to the magnets and Hall effect devices to prevent undesirable energization of the solenoid valve. Furthermore, the possibility of failure of the interlock is increased by the need for these additional electronic components, each of which is capable of failing. Cost and complexity of the interlock function are also increased.

DISCLOSURE OF THE INVENTION

The present invention is directed to overcoming one or more of the problems as set forth above.

In one aspect of the present invention, an apparatus is provided having a magnetically actuatable control member and magnetic means for producing a magnetic field to actuate the member, in which the improvement comprises a first elongated member being disposed near said control member, and a second elongated member being disposed near said control member, the magnetic means being movable relative to the first elongated member and the second elongated member between a first position at which a magnetic pathway is opened and a second position at which said magnetic pathway is closed from said magnetic means through said first elongated member to said control member and from said control member through said second elongated member to said magnetic means.

In another aspect of the present invention, apparatus is provided having a pair of control members being actuatable in response to control fields, and a pair of means for respectively producing said control fields, said pair of producing means being movable in relation to said pair of control members between a first position at which respective control field paths are open and a second position at which said respective control field paths are closed to actuate respectively said pair of control members, the improvement comprising means for bypassing said control fields from said pair of control members in response to said pair of producing means being at said second position.

With the present invention, intensification of the magnetic field can be obtained while using weaker magnets at a substantial distance from the magnetic control member. Also, with the present invention a magnetic interlock is provided to prevent simultaneous actuation of a pair of magnetic control members, whereby an additional electronic interlock is not needed.

BRIEF DESCRIPTION OF THE DRAWINGS

FIG. 10 is a side elevation taken along lines 10—10 of FIG. 9.

BEST MODE OF CARRYING OUT THE INVENTION

Figure 1:
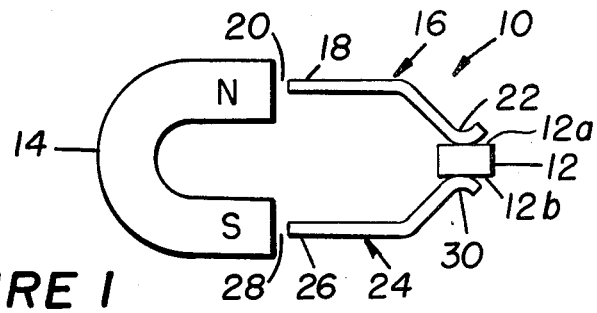
FIG. 1 is a plan view of an embodiment of the present invention for providing magnetic field intensification.

FIG. 1 shows a magnetic control circuit 10 having a magnetic control member 12 such as a Hall effect device. A magnet 14 such as a horseshoe magnet has a north pole N and a south pole S to produce a magnetic field of magnetic flux. An elongated bar 16 of magnetic material with low hysteresis has an end 18 adjacent the north pole N across an air gap 20 and an end 22 that is coupled to one side 12a of the Hall effect device 12. An elongated bar 24 of magnetic material with low hysteresis has an end 26 adjacent the south pole S across an air gap 28 and an end 30 coupled to the other side 12b of the Hall effect device 12.

The Hall effect device 12 is a switch that can be turned on, i.e., become electrically conductive, by applying an external control field or magnetic flux across the device 12. With the circuit 10 as shown in FIG. 1, the following closed magnetic pathway is produced. Magnet 14 will provide a magnetic flux that is substantially conducted or directed from the north pole N, across air gap 20, along bar 16 and through the device 12, along bar 24 and across gap 28 back to the south pole S. If the magnet 14 is moved in relation to the bars 16 and 24 and the device 12 so as to substantially increase the gaps 20 and 28, the magnetic pathway will be opened so that the flux from the magnet 14 will not be applied across the device 12, whereby the latter will be switched off. For example, the magnet 14 can be moved vertically into or out of the plane of FIG. 1 to switch off the device 12.

As can be seen from FIG. 1, the bar 16 and bar 24 permit the magnet 14 to be positioned a substantial distance from the Hall effect device 12. Yet, the bar 16 and bar 24 intensify the magnetic field at the Hall effect device 12 by concentrating the flux through the device 12. Therefore, flexibility is provided in the use of a particular sized magnet 14 and its spacing or positioning in relation to the device 12.

Figure 2:
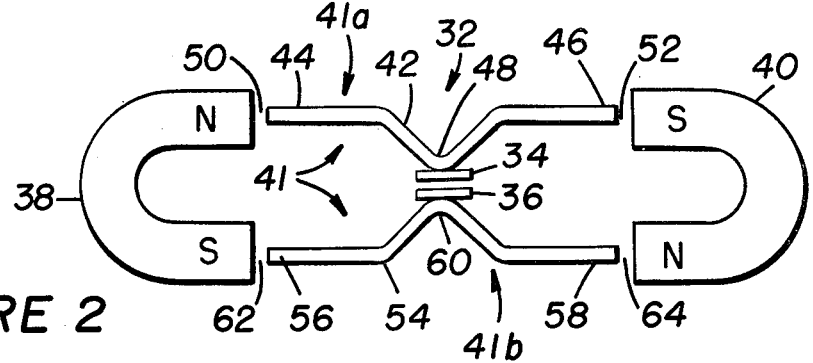
FIG. 2 is a plan view of an embodiment of the present invention for providing magnetic field intensification and a magnetic interlock.

FIG. 2 shows a magnetic control circuit 32 having a pair of magnetic control members such as a Hall effect device 34 and Hall effect device 36. A magnet 38 such as a horseshoe magnet has a north pole N and a south pole S. Another magnet 40 such as a horseshoe magnet has a south pole S and north pole N.

A magnetic flux concentrator 41 includes a field or flux directing means 41a which is an elongated bar 42 of magnetic material with low hysteresis. The bar 42 has an end 44, and end 46 and a V-shaped central portion or pole piece 48 coupled to one side of the Hall effect device 34. The end 44 is in proximity to the north pole N of the magnet 38 across a small air gap 50. The end 46 is positioned in proximity to the south pole S of the magnet 40 across a small air gap 52.

The flux concentrator 41 includes another field or flux directing means 41b which is an elongated bar 54 of magnetic material with low hysteresis. The bar 54 has an end 56, an end 58 and a V-shaped central portion or pole piece 60 coupled to one side of the Hall effect device 36. The end 56 is in proximity to the south pole S of magnet 38 across a small air gap 62. The end 58 is in proximity to the north pole N of magnet 40 across a small air gap 64.

The Hall effect device 34 and the Hall effect device 36 are disposed in FIG. 2 in back-to-back relation. That is, as will be further described, magnetic flux being directed from pole piece 48 and through device 34 and device 36 to pole piece 60 will actuate or turn on one of the devices, e.g. device 36. Magnetic flux being directed from pole piece 60 through device 36 and device 34 to pole piece 48 will actuate or turn on the other of the devices, e.g. device 34.

Figure 3:
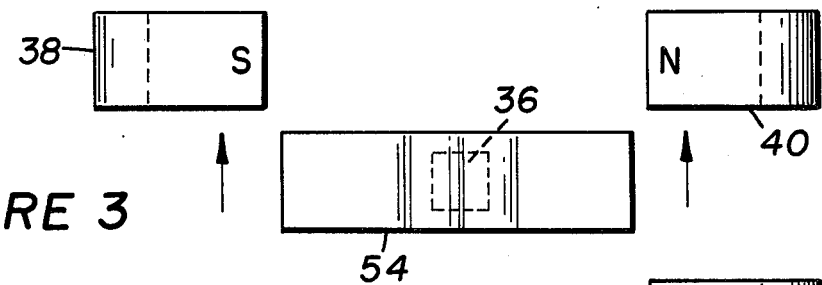
FIGS. 3–5 are front elevation views showing the operation of the invention of FIG. 2.
Figure 4:
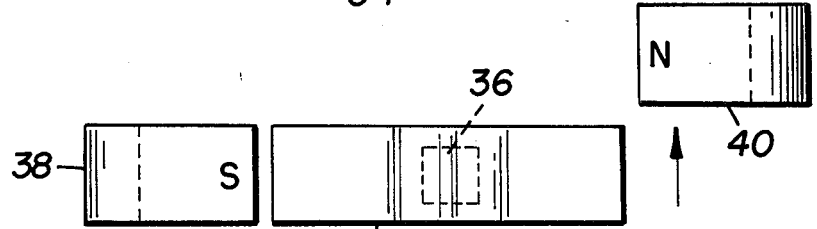

As indicated in FIG. 3, magnet 38 and magnet 40 are positioned vertically in relation to bar 54 and bar 42. In the position shown in FIG. 3, magnet 38 and magnet 40 are sufficiently displaced from the device 34 and device 36 so that the latter are in an off state. When magnet 38 is moved vertically into proximity to the bar 54 and bar 42 as shown in FIG. 4, a magnetic path will be produced to turn on one of the devices 34 and 36. More particularly, the magnetic flux will be directed from the north pole N of the magnet 38, across the air gap 50 and along the bar 42 to the central portion 48 where a north pole will be induced and where the flux will be intensified. From central portion 48, the flux will pass through the device 34 and the device 36 to the central portion 60 of the bar 54 where a south pole will be induced. From portion 60, the flux will be directed back along bar 54 and across the gap 62 to the south pole S of magnet 38. Only device 36 is switched on in the FIG. 4 position of control circuit 32.

If magnet 40 is brought vertically into position adjacent the bar 54 and bar 42, and magnet 38 returned to the position shown in FIG. 3, then only device 34 will be switched on. In this position (not shown), the magnetic flux will be directed from the north pole N of magnet 40, across air gap 64 and along the bar 54 to the central portion 60 where a north pole is induced and where the flux is intensified. From there the flux will pass through the device 36 and device 34 to the central portion 48, where a south pole is induced, and back along the bar 42 across the air gap 52 to the south pole S of magnet 40. This time only the device 34 is turned on.

Figure 5:
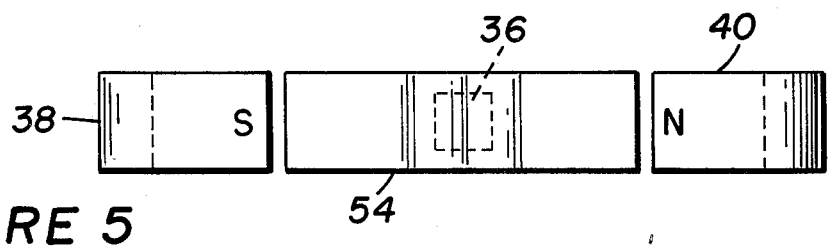

If the magnet 38 and the magnet 40 are vertically moved into the position shown in FIG. 5, then neither device 34 nor device 36 will be switched on. In this position, magnetic flux will be directed from the north pole N of magnet 38, across gap 50, along bar 42, bypassing the device 34, and then across gap 52 to the south pole S of magnet 40. Magnetic flux also will be directed from the north pole N of magnet 40, across gap 64 and along bar 54, bypassing device 36, and then across gap 62 to the south pole S of magnet 38. In other words, at central portion 48 a north pole and a south pole are induced by magnet 38 and magnet 40, respectively, whereby no magnetic flux passes through the device 34. The magnet 38 and the magnet 40 will attract one another through gap 50 and gap 52. Similarly, at central portion 60 a north pole and south pole are induced by magnet 40 and magnet 38, respectively, so that no magnetic flux passes through the device 36. The magnet 38 and magnet 40 attract one another through the gap 62 and the gap 64. Thus, flux concentrator 41 also functions to bypass the magnetic fluxes from the device 34 and device 36 when both magnet 38 and magnet 40 are moved into proximity to the concentrator 41.

Figure 6:
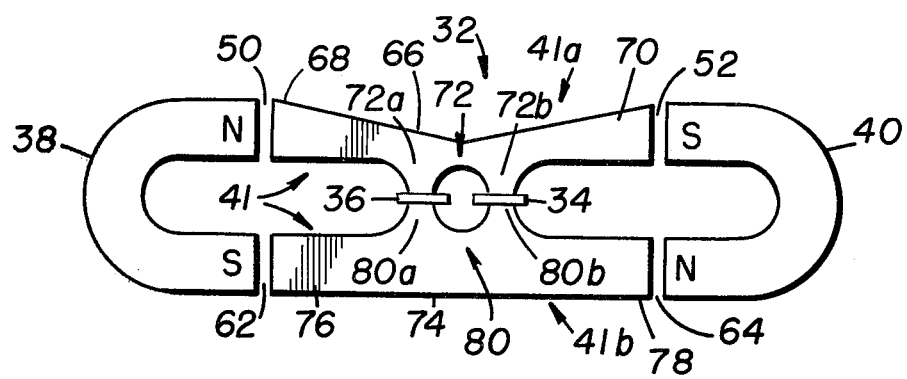
FIG. 6 is a plan view of an alternative embodiment of the invention of FIG. 2.

FIG. 6 shows an alternative embodiment of circuit 32 that functions in the same manner as described above. Like reference numerals are used in FIG. 6 to show like elements in FIG. 2. Thus, magnet 38, magnet 40 and flux concentrator 41 are used, together with Hall effect device 34 and Hall effect device 36. However, as shown in FIG. 6, the device 34 and device 36 are not positioned in back-to-back relation as in FIG. 2, but side-to-side or adjacent one another. The manner in which each device 34 and 36 can be turned on is described below.

An elongated bar 66 of the flux directing means 41a has an end 68 in proximity to the north pole N of the magnet 38 via air gap 50 and an end 70 in proximity to the south pole S of magnet 40 via air gap 52. Bar 66 has a central portion 72 divided into portions or pole pieces 72a and 72b that are coupled to one side of the device 36 and device 34, respectively.

An elongated bar 74 of the flux directing means 41b has an end 76 in proximity to the south pole S of magnet 38 via air gap 62 and an end 78 in proximity to the north pole N of the magnet 40 via air gap 64. Bar 74 also has a central portion 80 which is divided into portions or pole pieces 80a and 80b coupled, respectively, to the other side of device 36 and device 34.

The positioning of device 36 is such that only when a north pole is induced at portion 72a and a south pole induced at portion 80a can device 36 be turned on. On the other hand, the positioning of device 34 is such that only when a north pole is induced at portion 80b and a south pole induced at portion 72b can device 34 be turned on.

In a similar manner as described above, if only magnet 38 is moved vertically into proximity to the bar 66 and bar 74, magnetic flux will be directed from its north pole N across gap 50, and along bar 66 to the portion 72a where a north pole is induced and where the flux will be intensified. From there, the flux will continue across the device 36 to portion 80a where a south pole is induced, and back along the bar 74 and across the gap 62 to the south pole S of magnet 38, whereby device 36 will be turned on. In a similar manner, if only magnet 40 is brought in proximity to the bar 66 and bar 74, then only device 34 will be turned on since a north pole is induced at portion 80b and a south pole at portion 72b.

For the reasons given in discussing FIG. 5, in this FIG. 6 embodiment if magnet 38 and magnet 40 are simultaneously positioned in proximity to bar 66 and bar 74, then concentrator 41 will bypass the magnetic flux from device 36 and device 34. Consequently, neither of these devices will be turned on. North and south poles are induced at portion 72, whereby the flux will be directed from the north pole N of magnet 38 along bar 66, to the south pole S of magnet 40. North and south poles are induced at portion 80, whereby the flux will follow a path from the north pole N of magnet 40, along bar 74, to the south pole S of magnet 38.

Figure 7:
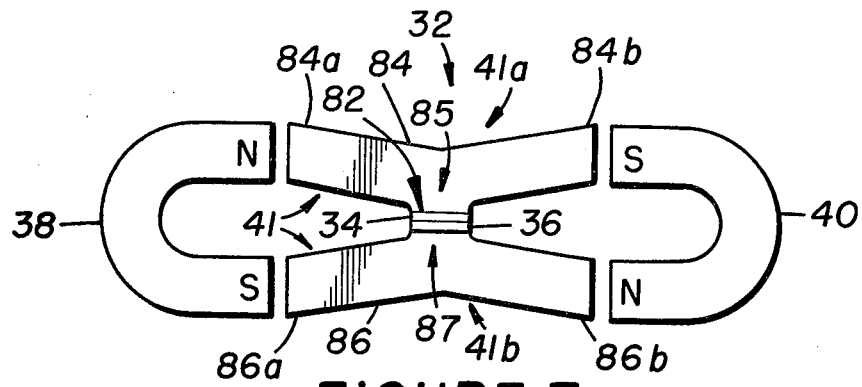
FIG. 7 is a plan view of yet another alternative embodiment of the invention of FIG. 2.

FIG. 7 shows another alternative embodiment of circuit 32 in which like reference numerals are used to show like elements in FIG. 2. Again, this FIG. 7 embodiment functions in a similar manner as the FIG. 2 and FIG. 6 embodiments. In circuit 32 of FIG. 7, the device 34 and device 36 are positioned in back-to-back relation to one another, similarly to the FIG. 2 embodiment, but in physical contact with one another as shown generally at 82. A bar 84 and a bar 86 of the flux directing means 41a, 41b have respective central portions or pole pieces 85 and 87 coupled to one side of device 34 and device 36. Only device 36 will be turned on when magnet 38 is brought in proximity to an end 84a of bar 84 and an end 86a of bar 86, while only device 34 will be turned on when magnet 40 is brought in proximity to an end 84b of bar 84 and an end 86b of bar 86. When magnet 38 and magnet 40 are both positioned in proximity to bar 84 and bar 86, the concentrator 41 will bypass the flux from device 34 and device 36 to keep them in an off state.

Figure 8:
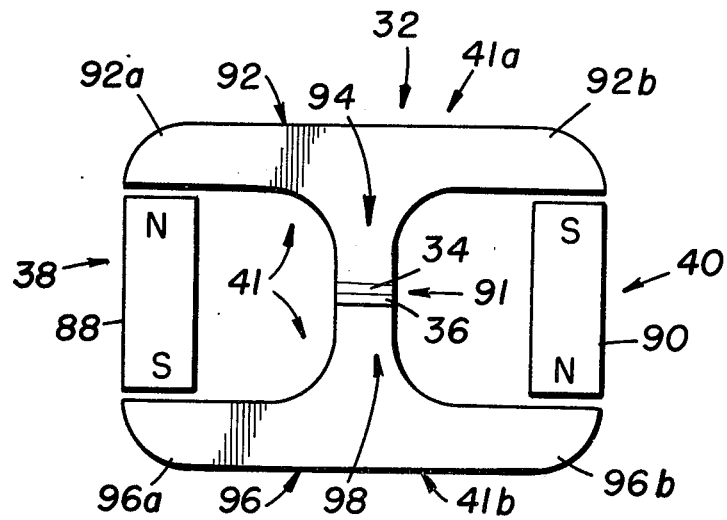
FIG. 8 is a plan view of still another alternative embodiment of the invention of FIG. 2.

FIG. 8 shows yet another embodiment of the circuit 32 which uses for magnet 38 a bar magnet 88 and for magnet 40 a bar magnet 90. The Hall effect device 34 and device 36 are coupled in back-to-back relation and in physical contact with one another as shown generally at 91 and similarly as in FIG. 7. A bar 92 of the flux directing means 41a has a central portion or pole piece 94 coupled to one side of the device 34 and a bar 96 of the flux directing means 41b has a central portion or pole piece 98 coupled to one side of the device 36. The circuit 32 of FIG. 8 operates in the same manner as described above when either or both magnets 88 or 90 are brought in proximity to the bars 92 and 96, particularly ends 92a, 96a and 92b, 96b of these bars. Thus, for example, if both magnets 88 and 90 are in proximity to concentrator 41, the latter will bypass the magnetic flux from device 34 and device 36 to keep them turned off.

Figure 9:
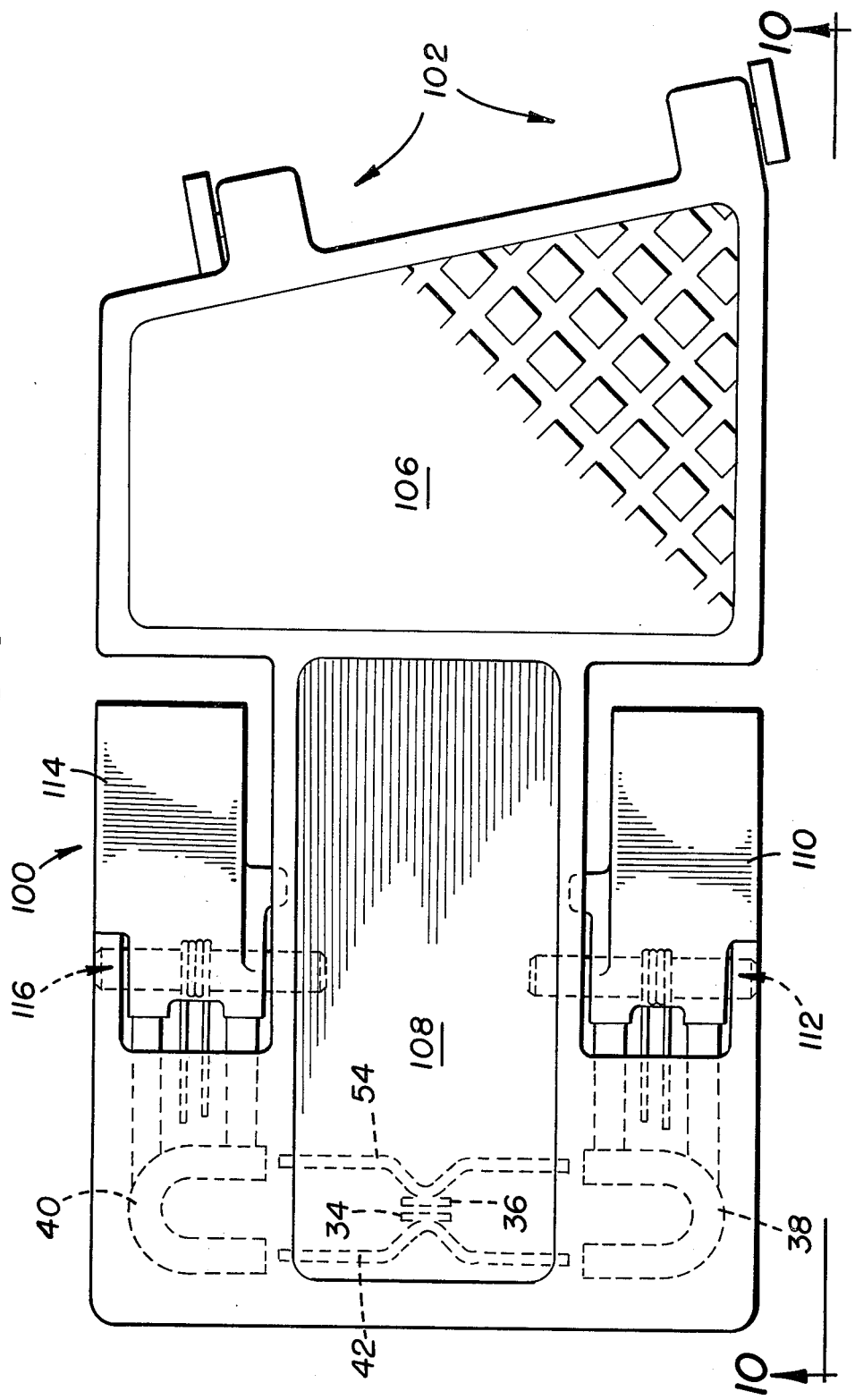
FIG. 9 is a plan view illustrating a practical application of the invention of FIG. 2.

FIG. 9 and FIG. 10 illustrate a practical application for the embodiment of FIG. 2. A pedal 100 is pivotally supported as shown generally at 102 to the floor board 104 of a vehicle such as a lift truck. Pedal 100 has a heel receiving portion 106 and a ball receiving portion 108. A forward drive pedal portion 110 is pivotally supported on one side of the ball receiving portion 108 by a pivot shown generally at 112. A reverse drive pedal portion 114 is pivotally supported on the other side of the ball receiving portion 108 by a pivot shown generally at 116. As shown in FIG. 10, a spring 118 is disposed between the underside of the ball receiving portion 108 and the forward drive pedal portion 110 to bias the latter in the position shown. A similar spring (not shown) biases the reverse drive pedal portion 114 to a similar position.

The Hall effect device 34 and Hall effect device 36, together with the bar 42 and bar 54 are coupled to the underside of the ball receiving portion 108. The magnet 38 is coupled to the forward drive pedal portion 110 and the magnet 40 is coupled to the reverse drive pedal portion 114.

As also illustrated in FIG. 10, a linkage shown generally at 120 couples the heel receiving portion 106 to the truck accelerator.

INDUSTRIAL APPLICABILITY

When the lift truck is to be placed in forward drive, the operator will place his foot on the forward drive portion 110 to pivot the latter in relation to the pedal portion 108 and bring the magnet 38 in proximity to the bar 42 and bar 54. This is the position shown in FIG. 4. Consequently, device 36 will be turned on to energize a solenoid of a valve (not shown) to shift a transmission (not shown) into forward drive. The operator can simultaneously place his foot on the pedal portion 108 to pivot the pedal 100 and move the linkage 120 to accelerate the vehicle in forward drive.

Similarly, if the lift truck is to be moved in a reverse direction, the operator will place his foot on the reverse drive pedal portion 114 to bring the magnet 40 in proximity to the bar 42 and the bar 54. This will result in device 34 being turned on to energize another solenoid of the valve to shift the transmission into reverse drive. Simultaneously, the operator can also depress pedal portion 108 to again move the linkage 120 to accelerate the truck in reverse drive.

The operator can inadvertently pivot both pedal portions 110 and 114 simultaneously to bring magnet 38 and magnet 40 in proximity to bar 42 and bar 54. However, this will be of no effect since the concentrator 41 will bypass the magnetic flux from device 34 and device 36 which will remain off, as already mentioned. Consequently, the solenoid valve will not be energized and the transmission will remain in neutral.

With respect to FIG. 1, with the present invention, a relatively weak magnet 14 can be employed, yet flux intensification is obtained by means of, for example, bars 16 and 24. The magnet 14 need not be placed too near device 12 so that flexibility is obtained in its location or positioning in relation to the device 12. For example, bar 16 and bar 24 can be made more elongated than shown to be able to space magnet 14 further away from device 12, and yet still obtain the flux intensification feature described.

Also, with respect to the embodiments of FIGS. 2 and 6-8, the above flux concentration can be obtained, as well as the magnetic interlock feature described. No additional control circuit, such as an electronic interlock, is required to avoid the results of simultaneous activation of the devices 34 and 36.

Other aspects, objects and advantages of this invention can be obtained from a study of the drawings, disclosure and the appended claims.

I claim:

1. In an apparatus (32) having a pair (34, 36) of control members being actuatable in response to respective control fields, and a pair (38, 40) of means for respectively producing said control fields, said pair (38, 40) of producing means being selectively movable in relation to said pair (34, 36) of control members between a first position at which respective control field paths are open and a second position at which said respective control field paths are closed to actuate respectively said pair (34, 36) of control members, the improvement comprising:
   means (41) for bypassing said control fields from said pair (34, 36) of control members in response to said pair (38, 40) of producing means being simultaneously at said second position.

2. In an apparatus (32) according to claim 1 wherein said means (41) for bypassing includes:
   (a) first means (41a) for directing one of said control fields from one (38) of said pair (38, 40) of producing means to the other (40) of said pair (38, 40) of producing means; and
   (b) second means (41b) for directing the other of said control fields from said other (40) of said pair (38, 40) of producing means to said one (38) of said pair (38, 40) of producing means.

3. In an apparatus (32) according to claim 2 wherein said pair (34, 36) of control members are magnetically actuatable, said pair (38, 40) of producing means are magnets (38, 40), and said first (41a) and said second (41b) directing means are elongated spaced apart bars (42, 54; 66, 74; 84, 86; 92, 96) of magnetic material each having ends (44, 46, 56, 58, 68, 70, 76, 78, 84a, 84b, 86a, 86b, 92a, 92b, 96a, 96b), said ends of said bars (42, 54; 66, 74; 84, 86; 92, 96) being disposed near said magnets (38, 40) and said control members (34, 36) being disposed in the space between said bars (42, 54; 66, 74; 84, 86; 92, 96) at said second position.

4. Magnetic control apparatus (32), comprising:
   (a) first (34) and second (36) magnetically actuatable control members;
   (b) first (38) and second (40) magnetic means for respectively producing magnetic fields to actuate said first (34) and second (36) control members, said first (38) and second (40) magnetic means being selectively movable between a first position in which actuation of said first (34) and second (36) control members is inhibited and a second position in which said first (34) or second (36) control member is actuated; and
   (c) magnetically permeable means (41) for directing said respective fields through said first (34) or said second control member (36) in response to said first magnetic means (38) or said second magnetic means (40) being at said second position and for directing said respective fields between said first (38) and second (40) magnetic means in response to said first (38) and second (40) magnetic means being at said second position.

5. Magnetic control apparatus (32) according to claim 4 wherein said first (38) and second (40) magnetic members include first (38) and second (40) magnets, respectively, each having a north pole (N) and a south pole (S), said first (38) and second (40) magnets being spaced apart at said second position with said north pole (N) of said first magnet (38) opposite said south pole (S) of said second magnet (40) and said north pole (N) of said second magnet (40) opposite said south pole (S) of said first magnet (38), and wherein said magnetically permeable means (41) includes a first elongated bar (41a) having a first end (44, 68, 84a or 92a) adjacent said north pole (N) of said first magnet (38) and a second end (46, 70, 84b or 92b) adjacent said south pole (S) of said second magnet (40) at said second position, and a second elongated bar (41b) having a first end (56, 76, 86a or 96a) adjacent said south poles (S) of said first magnet (38) and a second end (58, 78, 86b or 96b) adjacent said north pole (N) of said second magnet (40).

6. Magnetic control apparatus (32) according to claim 5 wherein said first (41a) and second (41b) elongated bars are spaced apart with said first (34) and second (36) control members therebetween, said first elongated bar (41a) having a pole piece (48, 85 or 94) between said first (44, 84a, 92a) and second (46, 84b, 92b) ends of said first bar (41a) and being adjacent said first control member (34), and said second elongated bar (41b) having a pole piece (60, 87, 98) between said first (56, 86a, 96a) and second (58, 86b, 96b) ends of said second bar (41b) and being adjacent said second control member (36).

7. Magnetic control apparatus (32) according to claim 6 wherein said first (34) and second (36) control members are Hall effect devices being positioned in back-toback relationship between each said pole piece (48, 60, 85, 87, 94, 98).

8. Magnetic control apparatus (32) according to claim 5 wherein said first (34) and second (36) control members are first (34) and second (36) Hall effect devices being positioned in side to side relationship, wherein said first (41a) and second (41b) elongated bars are spaced apart with said first (34) and second (36) Hall effect devices therebetween, and wherein said first elongated bar (41a) has first (72b) and second (72a) pole pieces between said first (68) and second (70) ends of said first bar (41a) and being adjacent said first (34) and second (36) Hall effect devices, respectively, and said second elongated bar (41b) has first (80b) and second (80a) pole pieces between said first (76) and second (78) ends of said second bar (41b) and being adjacent said first (34) and second (36) Hall effect devices, respectively.

* * * * *